United States Patent
Ishikawa et al.

(10) Patent No.: US 8,294,423 B2
(45) Date of Patent: Oct. 23, 2012

(54) VOLTAGE MEASURING DEVICE

(75) Inventors: Satoshi Ishikawa, Makinohara (JP);
Kimihiro Matsuura, Makinohara (JP);
Masashi Sekizaki, Makinohara (JP)

(73) Assignee: Yazaki Corporation, Tokyo (JP)

( * ) Notice: Subject to any disclaimer, the term of this patent is extended or adjusted under 35 U.S.C. 154(b) by 302 days.

(21) Appl. No.: 12/825,703

(22) Filed: Jun. 29, 2010

(65) Prior Publication Data

US 2011/0057659 A1 Mar. 10, 2011

(30) Foreign Application Priority Data

Sep. 4, 2009 (JP) ................................. 2009-204535

(51) Int. Cl.
*H01M 10/46* (2006.01)

(52) U.S. Cl. ...................................................... 320/116

(58) Field of Classification Search .................. 320/107, 320/112, 116, 118, 120, 122, 134, 136
See application file for complete search history.

(56) References Cited

U.S. PATENT DOCUMENTS

| | | | | |
|---|---|---|---|---|
| 5,629,601 A | * | 5/1997 | Feldstein | 320/119 |
| 2008/0100266 A1 | * | 5/2008 | Sobue | 320/134 |
| 2008/0185995 A1 | * | 8/2008 | Carrier et al. | 320/134 |
| 2010/0019735 A1 | * | 1/2010 | Hori et al. | 320/162 |
| 2010/0188046 A1 | * | 7/2010 | Liu et al. | 320/118 |
| 2010/0188047 A1 | * | 7/2010 | Liu et al. | 320/118 |

FOREIGN PATENT DOCUMENTS

JP 2009-017657 A 1/2009

* cited by examiner

*Primary Examiner* — Edward Tso (74) *Attorney, Agent, or Firm* — Sughrue Mion, PLLC (57) ABSTRACT

A voltage measuring device includes a current detecting section that detects a charging or discharging current of a multiple-set battery; block voltage detecting sections that detect voltages of a plurality blocks respectively; and a control section that outputs a request to the block voltage detecting sections via a first communication line to acquire voltage data. Each of the block voltage detecting sections includes an active power source and a lower-power source. The control section transmits a low-power consumption mode setting signal to the block voltage detecting sections respectively when the charging or discharging current has not been detected by the current detecting section for a first time period. Each of the block voltage detecting sections switches an operating mode from a normal mode to a low-power consumption mode when the low-power consumption mode setting signal is received.

4 Claims, 4 Drawing Sheets

VOLTAGE MEASURING DEVICE

BACKGROUND

The present invention relates to a voltage measuring device which detects a voltage of a multiple-set battery including plural unit cells connected in series to output a desired voltage.

For example, electric vehicles or hybrid vehicles include a high-voltage battery as a motor driving power source. Such a high-voltage battery obtains a high voltage by connecting plural unit cells in series, which are secondary batteries (storage battery) such as a nickel-hydrogen battery or a lithium battery.

All the secondary batteries are charged or discharged with the same power. Accordingly, when the secondary batteries have different deterioration conditions, the secondary batteries tend to be easily overcharged or over-discharged. Therefore, not to be overcharged or over-discharged, it is necessary to check the charging conditions of the unit cells. Accordingly, plural unit cells (for example, 55 unit cells) are partitioned into, for example, five blocks (that is, one block includes 11 unit cells), and the voltage of each block is measured in real time by a voltage detecting IC disposed every block.

The decrease in residual capacity of such secondary batteries can make it difficult a vehicle to travel any more, and thus it is necessary to avoid the waste of power. Accordingly, for example, a technique described in JP-A-2009-17657 has been proposed. In JP-A-2009-17657, the waste of power of the secondary batteries is prevented by switching the power supplied from the secondary batteries to a low-power consumption mode.

However, the above-mentioned voltage measuring device is switched to a low-power consumption state by turning off the voltage detecting IC when the voltage measuring device is out of order. Accordingly, when the voltage measuring device works normally and the voltage of the high-voltage battery does not vary, the low-power consumption operation is not performed. For example, it is assumed that the vehicle stops and the air conditioner is turned on. In this case, since the vehicle stops with its ignition turned on, the voltage of a high-voltage battery does not vary, but current is consumed to measure the voltage of the secondary battery. Accordingly, there is a problem that it is not possible to suppress power consumption with high precision.

SUMMARY

Therefore, the invention is made to solve the above-mentioned problem. It is an object of the invention to provide a voltage measuring device of a multiple-set battery which can suppress power consumption with high precision.

In order to achieve the above object, according to the present invention, there is provided a voltage measuring device for measuring an output voltage of a multiple-set battery having a plurality of unit cells which are connected in series to output a voltage, the voltage measuring device comprising:

a current detecting section that detects a charging or discharging current of the multiple-set battery;

block voltage detecting sections that detect voltages of a plurality blocks respectively, wherein the unit cells are divided into the blocks; and a control section connected to the block voltage detecting sections via a first communication line and a second communication line and that outputs a voltage measuring request to the block voltage detecting sections via the first communication line to acquire voltage data detected by the block voltage detecting sections, wherein each of the block voltage detecting sections includes:
an active power source which is supplied with power from the unit cells of corresponding block and supplies power to the block voltage detecting section; and
a lower-power source which is supplied with power from the unit cells of the corresponding block and supplies power to a communication section for the second communication line disposed in the block voltage detecting section;

wherein the control section transmits a low-power consumption mode setting signal to the block voltage detecting sections respectively via the second communication line when the charging or discharging current has not been detected by the current detecting section for a first time period; and wherein each of the block voltage detecting sections switches an operating mode from a normal mode where the block voltage detecting section is activated with the power from the active power source to a low-power consumption mode where the block voltage detecting section is activated with the power supplied only from the low-power consumption source when the low-power consumption mode setting signal is received.

Preferably, the control section transmits a normal mode setting signal to the block voltage detecting sections respectively via the second communication line when the charging or discharging current is detected after the low-power consumption mode setting signal is transmitted, and each of the block voltage detecting sections switches the operating mode to the normal mode when the normal mode setting signal is received.

Preferably, when the charging or discharging current is not detected until a second time period elapses after the low-power consumption mode setting signal is transmitted, the control section transmits a switching signal for switching the block voltage detecting sections respectively to the normal mode only for a specific time period at the time point that the second time period has elapsed, and the control section transmits a voltage measuring request to the block voltage detecting sections respectively via the first communication line within the specific time period and acquires voltage data detected by the block voltage detecting sections respectively.

According to the present invention, there is also provided a voltage measuring device for measuring an output voltage of a multiple-set battery having a plurality of unit cells which are connected in series to output a voltage, the voltage measuring device comprising:

block voltage detecting sections that detect voltages of a plurality blocks respectively, wherein the unit cells are divided into the blocks; and a control section connected to the block voltage detecting sections via a first communication line and a second communication line and that outputs a voltage measuring request to the block voltage detecting sections via the first communication line to acquire voltage data detected by the block voltage detecting sections, wherein each of the block voltage detecting sections includes:
an active power source which is supplied with power from the unit cells of corresponding block and supplies power to the block voltage detecting section; and
a lower-power source which is supplied with power from the unit cells of the corresponding block and supplies power to a communication section for the second communication line disposed in the block voltage detecting section;

wherein the control section includes a voltage variation detecting section for detecting variation of the voltage data acquired by the block voltage detecting sections respectively;

wherein the control section transmits a low-power consumption mode setting signal to the block voltage detecting sections respectively via the second communication line when a voltage variation has not been detected by the voltage variation detecting section for a third time period; and wherein each of the block voltage detecting sections switches an operating mode from a normal mode where the block voltage detecting section is activated with the power from the active power source to a low-power consumption mode where the block voltage detecting section is activated with the power supplied only from the low-power consumption source when the low-power consumption mode setting signal is received.

According to the above configuration, when the charging or discharging current of the multiple-set battery is not continuously detected for the first time period (for example, 30 minutes), the normal mode where the device is activated with the power supplied from the active power source is switched to the low-power consumption mode where the device is activated with the power supplied only from the lower-power source. By detecting the charging or discharging current of the multiple-set battery and switching the operating mode from the normal mode to the low-power consumption mode, the current for detecting the voltages of the multiple-set battery is not consumed when the voltages of the multiple-set battery do not vary. That is, when a vehicle stops for a predetermined time period with its ignition turned on, the operating mode can be switched to the low-power consumption mode. Accordingly, it is possible to provide a voltage measuring device for multiple-set battery which can suppress power consumption with high precision.

Since the normal mode is switched to the low-power consumption mode via a second communication line connected to the control section, a complicated circuit configuration for switching the normal mode to the low-power consumption mode is not necessary, thereby reducing the number of components and thus reducing manufacturing costs.

According to the above configuration, when the charging or discharging current is detected after the low-power consumption mode setting signal is output, the low-power consumption mode is switched to the normal mode. Accordingly, when the current of the multiple-set battery is consumed in the low-power consumption mode, the operating mode can be switched to the normal mode so as to detect the voltages of the blocks. Therefore, it is possible to provide a voltage measuring device for the multiple-set battery with high general usability.

According to the above configuration, when the charging or discharging current is not detected until the second predetermined time period (for example, 1 hour) elapses after the low-power consumption mode setting signal is transmitted, a switching signal for switching the operating mode to the normal mode only for a specific time period is transmitted at the time point that the second predetermined time period has elapsed. Accordingly, since abnormalities of the multiple-set battery can be checked by periodically detecting the voltages of the multiple-set battery even in the low-power consumption mode, it is possible to provide a voltage measuring device for the multiple-set battery with high general usability.

According to the above configuration, when the variation in voltage data of each of the blocks is continuously not detected for the third predetermined time period (for example, 40 minutes), the normal mode where the device is activated with the power supplied from the active power source is switched to the low-power consumption mode where the device is activated with the power supplied only from the low-power consumption source. By detecting the variation in voltage data of each of the blocks and switching the operating mode from the normal mode to the low-power consumption mode, the current for detecting the voltages of the multiple-set battery is not consumed when the voltages of the multiple-set battery do not vary. That is, when a vehicle stops for a predetermined time period with its ignition turned on, the operating mode can be switched to the low-power consumption mode. Accordingly, it is possible to provide a voltage measuring device for the multiple-set battery which can suppress power consumption with high precision.

Since the normal mode is switched to the low-power consumption mode via a second communication circuit connected to the control section, a complicated circuit configuration for switching the normal mode to the low-power consumption mode is not necessary, thereby reducing the number of components and thus reducing manufacturing costs.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Figure 1:
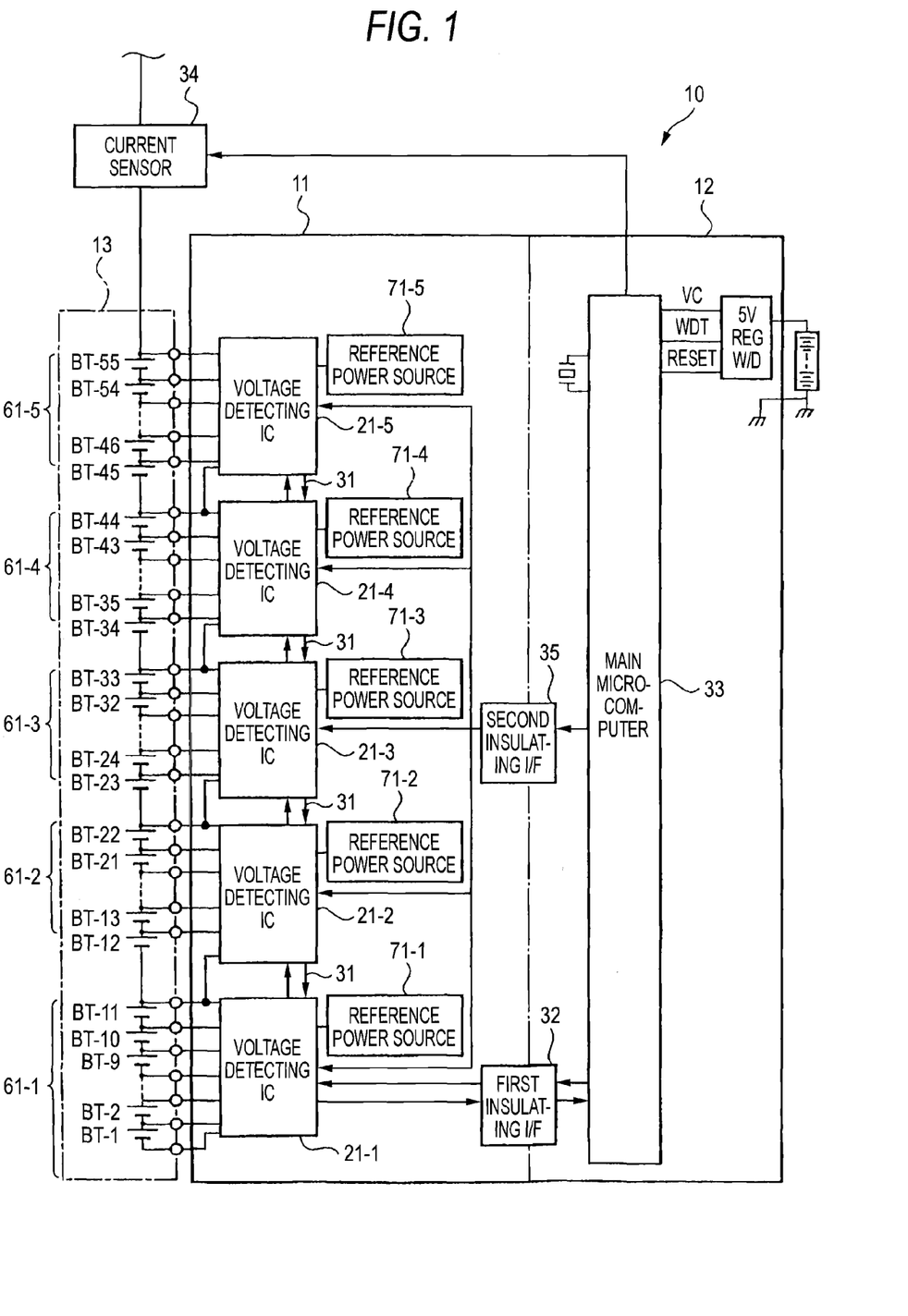
FIG. 1 is a block diagram illustrating a configuration of a voltage measuring device for the multiple-set battery according to an embodiment of the invention.

Hereinafter, embodiments of the invention will be described with reference to the accompanying drawings. FIG. 1 is a block diagram illustrating a voltage measuring device 10 and a secondary battery 13 (multiple-set battery) including plural unit cells BT1 to BT55 according to an embodiment of the invention. The secondary battery 13 employed in this embodiment is used as a high-voltage battery for driving a motor used for, for example, an electric vehicle, a hybrid vehicle, or the like.

As shown in FIG. 1, the voltage measuring device 10 according to this embodiment is partitioned into a high-voltage side device 11 and a low-voltage side device 12 with a first isolating interface (first communication line) 32 and a second isolating interface (second communication line) 35.

The high-voltage side device 11 includes five voltage detecting ICs (block voltage detecting sections), that is, a first voltage detecting IC 21-1 to a fifth voltage detecting IC 21-5. The first voltage detecting IC 21-1 measures output voltages of 11 unit cells BT1 to BT11 classified into a first block 61-1. The second voltage detecting IC 21-2 measures output voltages of 11 unit cells BT12 to BT22 classified into a second block 61-2, the third voltage detecting IC 21-3 measures output voltages of 11 unit cells BT23 to BT33 classified into a third block 61-3, the fourth voltage detecting IC 21-4 measures output voltages of 11 unit cells BT34 to BT44 classified into a fourth block 61-4, and the fifth voltage detecting IC 21-5 measures output voltages of 11 unit cells BT45 to BT55 classified into a fifth block 61-5.

Each of the voltage detecting ICs 21-1 to 21-5 includes an A/D converter 26 (see FIG. 2), and converts an analog voltage signal (a voltage signal of 11 unit cells connected in series) measured for each block (first to fifth blocks) into a digital voltage signal using reference voltages output from reference power sources 71-1 to 71-5.

The second to fifth voltage detecting ICs 21-2 to 21-5 are connected to the first voltage detecting IC 21-1 via the communication line 31 and the first voltage detecting IC 21-1 is connected to a main microcomputer (control section) 33 disposed in the low-voltage side device 12 via the first isolating interface 32 (first communication circuit). That is, the voltage detecting ICs 21-1 to 21-5 are daisy-chained to the main microcomputer 33 via the first isolating interface 32.

Each of the voltage detecting ICs 21-1 to 21-5 includes an active power source 22 (see FIG. 2) being supplied with power from the unit cells and supplying power for activating the voltage detecting ICs 21-1 to 21-5. The main microcomputer 33 switches the supply of power from the active power sources 22 to the voltage detecting ICs 21-1 to 21-5 via the second isolating interface 35.

The voltage measuring device 10 includes a current sensor 34 (current detecting section). The current sensor detects the charging or discharging current charged into or discharged from the secondary battery 13 including the plural unit cells BT1 to BT55.

The main microcomputer 33 outputs a low-power consumption mode setting signal to the voltage detecting ICs 21-1 to 21-5 via the second isolating interface 35 when the charging or discharging current is not continuously detected by the current sensor 34 for a first predetermined time period (for example, 30 minutes). Then, the respective voltage detecting ICs 21-1 to 21-5 switches its operating mode from a normal mode where the device works with power from the active power source 22 to a low-power consumption mode where the device works with power from only the low-power consumption source 23 (see FIG. 2), when receiving the low-power consumption mode setting signal. Details thereof will be described later.

Figure 2:
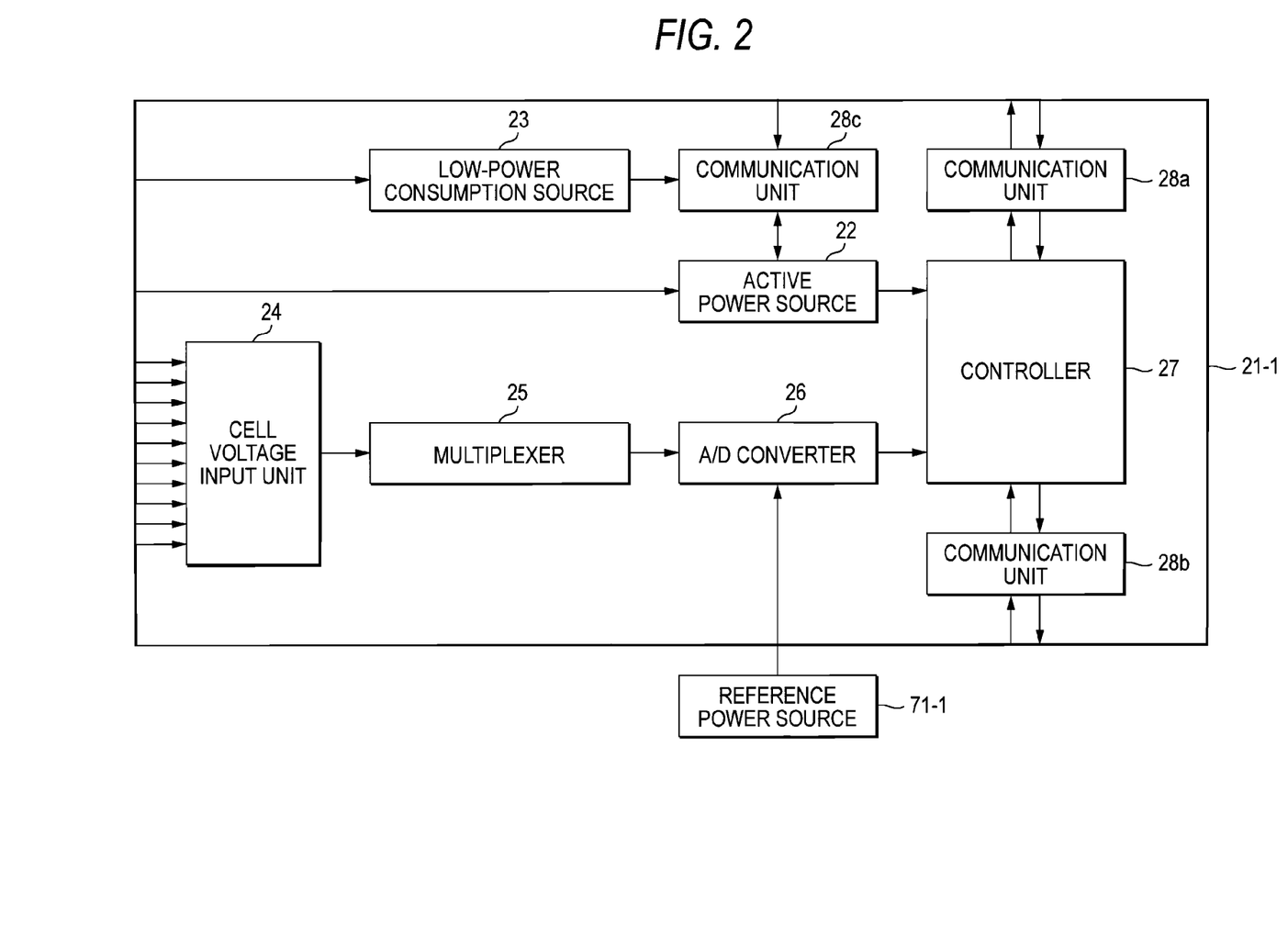
FIG. 2 is a block diagram illustrating a detailed configuration of the voltage measuring device according to the embodiment of the invention.

FIG. 2 is a block diagram illustrating the internal configuration of the first voltage detecting IC 21-1. The detailed configuration of the first voltage detecting IC 21-1 will be described with reference to FIG. 2. The second to fifth voltage detecting ICs 21-2 to 21-5 have the same configuration as the first voltage detecting IC 21-1 and detailed description thereof will not be repeated.

As shown in FIG. 2, the first voltage detecting IC 21-1 includes an active power source 22 being supplied with power from the unit cells BT1 to BT11 of the first block 61-1 and supplying power for activating the first voltage detecting IC 21-1 and a low-power consumption source 23 being supplied with power from the unit cells BT1 to BT11 of the first block 61-1 and supplying power to a communication section for the second isolating interface 35.

The first voltage detecting IC 21-1 includes a cell power input unit 24 detecting output power of the unit cells BT1 to BT11 of the first block 61-1, a multiplexer 25 converting voltage signals of the unit cells output from the cell power input unit 24 into one-channel time-series signals, and an A/D converter 26 converting the voltage signals of the units cells output from the multiplexer 25 into digital signals using a reference voltage for A/D conversion supplied from a reference power source 71-1.

As shown in FIG. 2, the voltage detecting IC 21-1 includes a communication unit 28a and a communication unit 28b connected to the second voltage detecting IC 21-2 and the main microcomputer 33 (see FIG. 1), respectively, and a communication unit 28c connected to the main microcomputer 33 and serving as a communication section for the second isolating interface 35.

The communication units 28a and 28b transmit and receive various signals to and from the second voltage detecting IC 21-2 and the main microcomputer 33 (see FIG. 1). Examples of the signals transmitted to the main microcomputer include the voltage signals obtained by detecting the voltages of the unit cells. The communication units relays the signals transmitted via the communication line 31 from the second to fifth voltage detecting ICs 21-2 to 21-5 daisy-chained and transmit the signals to the main microcomputer 33.

The communication units receive various signals transmitted from the main microcomputer 33 and transmit the received signals to the desired voltage detecting IC via the communication line 31. Examples of the signals transmitted from the main microcomputer 33 to the voltage detecting ICs 21-1 to 21-5 include a command signal for starting the voltage detection of the unit cells.

The communication unit 28c receives signals from the main microcomputer 33 (see FIG. 1). Specifically, the communication unit receives from the main microcomputer 33 a normal mode setting signal for supplying power from the active power sources 22 of the voltage detecting ICs 21-1 to 21-5 and a low-power consumption mode setting signal for supplying power only from the low-power consumption source 23. When the normal mode setting signal for starting the supply of power from the active power sources 22 of the voltage detecting ICs 21-1 to 21-5 is transmitted from the main microcomputer 33 (see FIG. 1), the active power sources 22 are turned on to start the supply of power from the active power sources 22. When the low-power consumption mode setting signal for stopping the supply of power from the active power sources 22 of the voltage detecting ICs 21-1 to 21-5 is transmitted from the main microcomputer 33, the supply of power from the active power sources 22 is stopped. When the supply of power from the active power sources 22 is stopped, the supply of power from the low-power consumption sources 23 is continued and thus the communication unit 28c is continued to work.

The main microcomputer 33 includes a register (not shown) for storing data and stores the voltage data by the use of the voltage detecting ICs 21-1 to 21-5. When a higher-level device (not shown) is connected thereto and a voltage reading request of the voltage detecting ICs 21-1 to 21-5 is given, the main microcomputer 33 transmits the newest voltage data among the voltage data stored in the register to the higher-level device.

Figure 3:
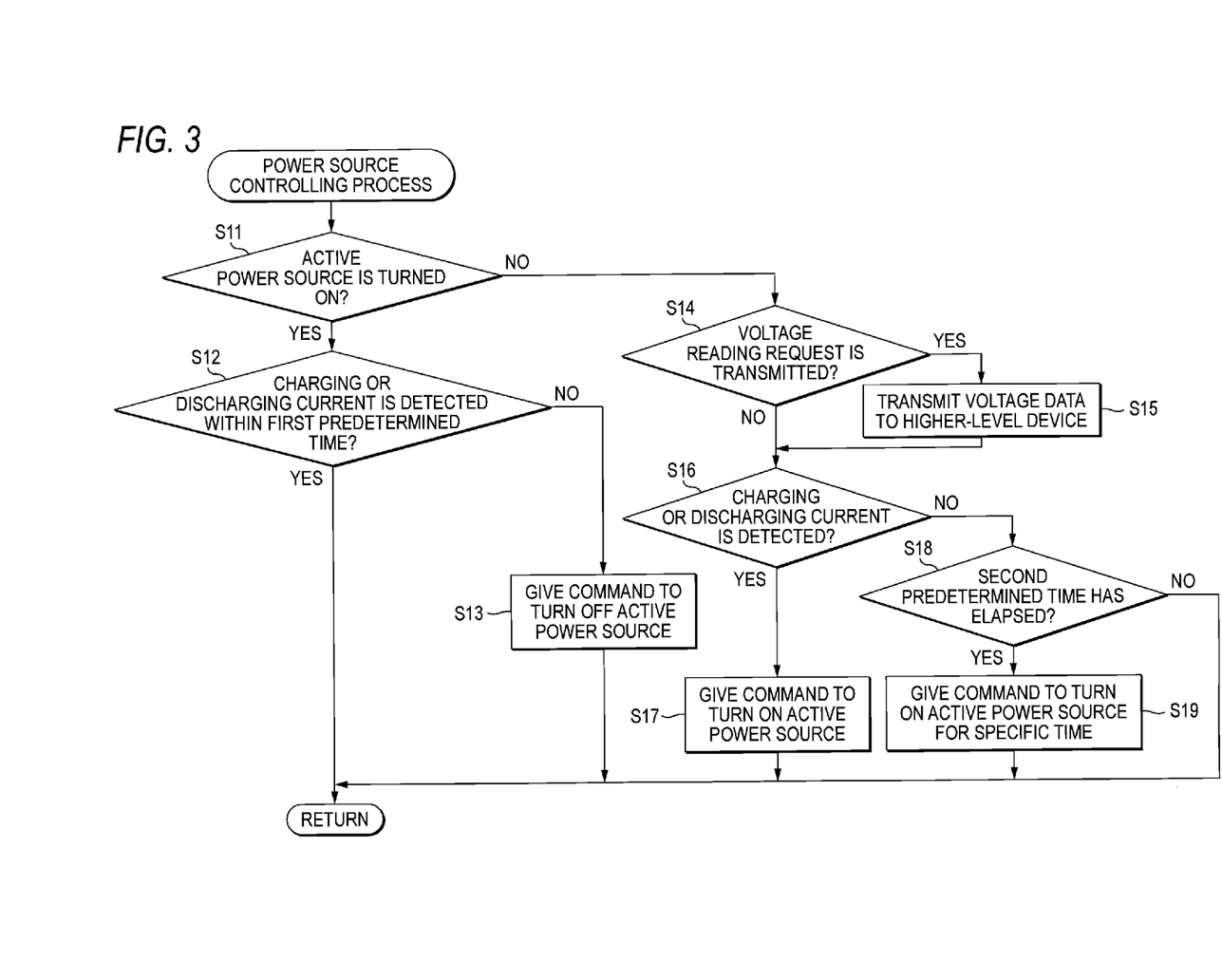
FIG. 3 is a flowchart illustrating a flow of a power source controlling process in the voltage measuring device according to the embodiment of the invention.

A power source controlling process performed by the voltage measuring device 10 according to this embodiment will be described with reference to the flowchart shown in FIG. 3.

First, in step S11, the main microcomputer 33 determines whether the active power sources 22 are turned on. That is, the main microcomputer 33 transmits the normal mode setting signal to the voltage detecting ICs 21-1 to 21-5 via the second isolating interface 35 and determines whether the operating mode is the normal mode where the voltage detecting ICs 21-1 to 21-5 work with the power supplied from the active power sources 22.

When it is determined in step S11 that the active power sources 22 are turned on (YES in step S11), the main microcomputer 33 determines whether the charging or discharging current is detected by the current sensor 34 for a first predetermined time period (for example, 30 minutes) in step S12.

When it is determined that the charging or discharging current is not detected for the first predetermined time period (NO in step S12), the main microcomputer 33 transmits a command to turn off the active power sources 22 in step S13. That is, the main microcomputer 33 transmits the low-power consumption mode setting signal to the voltage detecting ICs 21-1 to 21-5 via the second isolating interface 35. The voltage detecting ICs 21-1 to 21-5 receiving the low-power consumption mode setting signal stop the supply of power from the active power sources 22 and switches the operating mode to the low-power consumption mode where they work with the power supplied only from the low-power consumption sources 23. When the power is supplied only from the low-power consumption sources 23, the communication unit 28c is continuously supplied with the power and thus the communication unit 28c continues to work.

On the other hand, when the main microcomputer 33 determines that the active power sources 22 are not turned on in step S11 (NO in step S11), that is, when the main microcomputer 33 transmits the low-power consumption mode setting signal to the voltage detecting ICs 21-1 to 21-5 via the second isolating interface 35 and determines that the operating mode is the low-power consumption mode, it determines whether a voltage reading request of the voltage detecting ICs 21-1 to 21-5 is given from a higher-level device (not shown) in step S14.

When it is determined that the voltage reading request of the voltage detecting ICs 21-1 to 21-5 is given from the higher-level device (YES in step S14), the main microcomputer 33 transmits the newest voltage data among the voltage data detected by the voltage detecting ICS 21-1 to 21-5 and stored in the register (not shown) of the main microcomputer 33 to the higher-level device in step S15.

On the other hand, when it is determined in step S14 that the voltage reading request of the voltage detecting ICs 21-1 to 21-5 is not given from the higher-level device (NO in step S14) or after the process of step S15 is performed, the main microcomputer 33 determines whether the charging or discharging current is detected by the current sensor 34 in step S16.

When it is determined in step S16 that the charging or discharging current is detected by the current sensor 34 (YES in step S16), the main microcomputer 33 outputs a command to turn on the active power sources 22 in step S17. That is, the main microcomputer 33 transmits the normal mode setting signal to the voltage detecting ICs 21-1 to 21-5 via the second isolating interface 35. The voltage detecting ICs 21-1 to 21-5 receiving the normal mode setting signal switches the operating mode to the normal mode where they work with the power supplied from the active power sources 22.

On the other hand, when it is determined that the charging or discharging current is not detected by the current sensor 34 (NO in step S16), the main microcomputer 33 determines, in step S18, whether the second predetermined time period (for example, 1 hour) has passed after the low-power consumption mode setting is transmitted.

When it is determined that the second predetermined time period has passed after the low-power consumption mode setting signal is transmitted (YES in step S18), the main microcomputer 33 outputs a command to turn on the active power sources 22 for a specific time period in step S19. When the charging or discharging current is not detected by the current sensor 34 until the second predetermined time period elapses, the main microcomputer 33 transmits a switching signal for switching the operation mode of the voltage detecting ICs 21-1 to 21-5 to the normal mode only for the specific time period at the time point that the second predetermined time period has passed. Then, the main microcomputer 33 transmits the voltage measuring request to the voltage detecting ICs 21-1 to 21-5 via the first isolating interface 32 within the specific time period and acquires the voltage data detected by the voltage detecting ICs 21-1 to 21-5.

When it is determined in step S12 that the charging or discharging current is detected by the current sensor 34 within the first predetermined time period (YES in step S12) and when it is determined in step S18 that the second predetermined time period has not passed (NO in step S18), the main microcomputer 33 ends the power source controlling process after ending the process of step S13, the process of step S17, and the process of step S19.

As described above, when the charging or discharging current is not continuously detected by the current sensor 34 for the first predetermined time period (for example, 30 minutes), the main microcomputer 33 transmits the low-power consumption mode setting signal to the voltage detecting ICs 21-1 to 21-5 via the second isolating interface 35.

In the voltage measuring device 10 according to this embodiment, when the charging or discharging current is not continuously detected by the current sensor 34 for the first predetermined time period (for example, 30 minutes), the operating mode is switched from the normal mode where the device works with the power supplied from the active power sources 22 to the low-power consumption mode where the device works with the power supplied only from the low-power consumption sources 23. By detecting the charging or discharging current by the use of the current sensor 24 and switching the operating mode from the normal mode to the low-power consumption mode, the current for detecting the voltage of the secondary battery 13 is not consumed when the voltage of the secondary battery 13 does not vary. That is, when a vehicle stops for a predetermined time period with its ignition turned on, the operating mode can be switched to the low-power consumption mode. Accordingly, it is possible to provide a voltage measuring device for multiple-set battery which can suppress power consumption with high precision.

Since the normal mode is switched to the low-power consumption mode via the second isolating interface 35 connected to the main microcomputer 33, a complicated circuit configuration for switching the normal mode to the low-power consumption mode is not necessary, thereby reducing the number of components and thus reducing manufacturing costs.

When the charging or discharging current is detected by the current sensor 34 after the low-power consumption mode setting signal is output, the low-power consumption mode is switched to the normal mode. Accordingly, when the current of the secondary battery 13 is consumed in the low-power consumption mode, the operating mode can be switched to the normal mode so as to detect the voltages of the voltage detecting ICs 21-1 to 21-5. Therefore, it is possible to provide a voltage measuring device for multiple-set battery with high general usability.

When the charging or discharging current is not detected until the second predetermined time period (for example, 1 hour) has passed after the low-power consumption mode setting signal is transmitted, a switching signal for switching the operating mode to the normal mode only for a specific time period is transmitted at the time point that the second predetermined time period has passed. Accordingly, since abnormalities in the multiple-set battery can be checked by periodically detecting the voltage of the secondary battery 13 even in the low-power consumption mode, it is possible to provide a voltage measuring device for multiple-set battery with high general usability.

When the operating mode is set to the low-power consumption mode and the voltage reading request of the voltage detecting ICs 21-1 to 21-5 is given from a higher-level device, the newest voltage data among the voltage data stored in the register is transmitted to the higher-level device. When the operating mode is set to the low-power consumption mode, the voltage detecting ICs 21-1 to 21-5 do not detects the voltages of the blocks. Accordingly, when the voltage data is not transmitted in response to the voltage reading request, the higher-level device determines that the voltage detecting ICs 21-1 to 21-5 are out of order, thereby making it necessary to change the configuration of the higher-level device. However, it is possible to reduce the power consumption without changing the configuration of the higher-level device, by transmitting the newest voltage data to the higher-level device.

Figure 4:
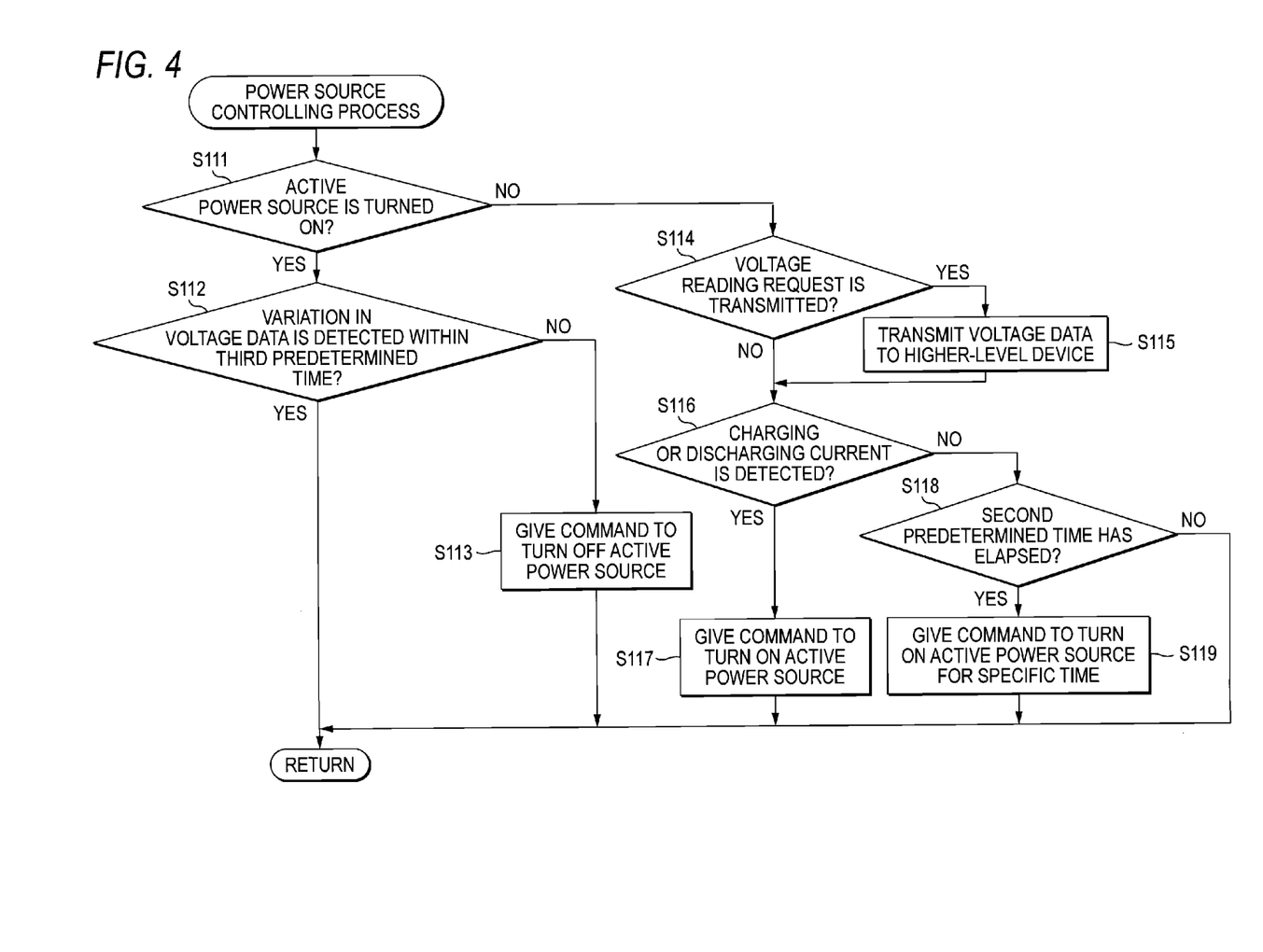
FIG. 4 is a flowchart illustrating a flow of a power source controlling process in the voltage measuring device according to another embodiment of the invention.

Another embodiment of the invention will be described with reference to the accompanying drawings. FIG. 4 shows another embodiment of the invention, where the same reference numerals and signs denote the same elements as the above-mentioned embodiment and description thereof is not repeated. FIG. 4 is a flowchart illustrating a flow of the power source controlling process in a voltage measuring device 10 according to this embodiment.

In this embodiment, the main microcomputer 33 detects a variation in voltage data acquired by the voltage detecting ICs 21-1 to 21-5, and outputs the low-power consumption mode setting signal to the voltage detecting ICs 21-1 to 21-5 via the second isolating interface 35 when the variation in voltage is not continuously detected for a third predetermined time period (for example, 40 minutes).

First, in step S111, the main microcomputer 33 determines whether the active power sources 22 are turned on. That is, the main microcomputer 33 transmits the normal mode setting signal to the voltage detecting ICs 21-1 to 21-5 via the second isolating interface 35 and determines whether the operating mode is the normal mode where the voltage detecting ICs 21-1 to 21-5 work with the power from the active power sources 22.

When it is determined in step S111 that the active power sources 22 are turned on (YES in step S111), the main microcomputer 33 determines whether the variation in voltage data acquired by the voltage detecting ICs 21-1 to 21-5 is detected for a third predetermined time period (for example, 40 minutes) in step S112.

When it is determined that the variation in voltage data is not continuously detected for the third predetermined time period (NO in step S112), the main microcomputer 33 transmits a command to turn off the active power sources 22 in step S113. That is, the main microcomputer 33 transmits the low-power consumption mode setting signal to the voltage detecting ICs 21-1 to 21-5 via the second isolating interface 35. The voltage detecting ICs 21-1 to 21-5 receiving the low-power consumption mode setting signal stop the supply of power from the active power sources 22 and switches the operating mode to the low-power consumption mode where they work with the power supplied only from the low-power consumption sources 23. When the power is supplied only from the low-power consumption sources 23, the communication unit 28c is continuously supplied with the power and thus the communication unit 28c continues to work.

On the other hand, when the main microcomputer 33 determines that the active power sources 22 are not turned on in step S111 (NO in step S111), that is, when the main microcomputer 33 transmits the low-power consumption mode setting signal to the voltage detecting ICs 21-1 to 21-5 via the second isolating interface 35 and determines that the operating mode is the low-power consumption mode, it determines whether a voltage reading request of the voltage detecting ICs 21-1 to 21-5 is given from a higher-level device (not shown) in step S114.

When it is determined that the voltage reading request of the voltage detecting ICs 21-1 to 21-5 is given from the higher-level device (YES in step S114), the main microcomputer 33 transmits the newest voltage data among the voltage data detected by the voltage detecting ICS 21-1 to 21-5 and stored in the register (not shown) of the main microcomputer 33 to the higher-level device in step S115.

On the other hand, when it is determined in step S114 that the voltage reading request of the voltage detecting ICs 21-1 to 21-5 is not given from the higher-level device (NO in step S114) or after the process of step S115 is performed, the main microcomputer 33 determines whether the charging or discharging current is detected by the current sensor 34 in step S116.

When it is determined in step S116 that the charging or discharging current is detected by the current sensor 34 (YES in step S116), the main microcomputer 33 outputs a command to turn on the active power sources 22 in step S117. That is, the main microcomputer 33 transmits the normal mode setting signal to the voltage detecting ICs 21-1 to 21-5 via the second isolating interface 35. The voltage detecting ICs 21-1 to 21-5 receiving the normal mode setting signal switches the operating mode to the normal mode where they work with the power supplied from the active power sources 22.

On the other hand, when it is determined that the charging or discharging current is not detected by the current sensor 34 (NO in step S116), the main microcomputer 33 determines, in step S118, whether the second predetermined time period (for example, 1 hour) has passed after the low-power consumption mode setting is transmitted.

When it is determined that the second predetermined time period has passed after the low-power consumption mode setting signal is transmitted (YES in step S118), the main microcomputer 33 outputs a command to turn on the active power sources 22 for a specific time period in step S119. That is, when the charging or discharging current is not detected by the current sensor 34 until the second predetermined time period elapses, the main microcomputer 33 transmits a switching signal for switching the operation mode of the voltage detecting ICs 21-1 to 21-5 to the normal mode only for the specific time period at the time point that the second predetermined time period has passed. Then, the main microcomputer 33 transmits the voltage measuring request to the voltage detecting ICs 21-1 to 21-5 via the first isolating interface 32 within the specific time period and acquires the voltage data detected by the voltage detecting ICs 21-1 to 21-5.

When it is determined in step S112 that variation in voltage data is detected within the third predetermined time period (YES in step S112) and when it is determined in step S118 that the second predetermined time period has not passed (NO in step S118), the main microcomputer 33 ends the power source controlling process after ending the process of step S113, the process of step S117, and the process of step S119.

As described above, when the variation in voltage data acquired by the voltage detecting ICs 21-1 to 21-5 is not continuously detected for the third predetermined time period (for example, 40 minutes), the main microcomputer 33 transmits the low-power consumption mode setting signal to the voltage detecting ICs 21-1 to 21-5 via the second isolating interface 35.

In the voltage measuring device 10 according to this embodiment, when the variation in voltage data acquired by the voltage detecting ICs 21-1 to 21-5 is not continuously detected for the third predetermined time period (for example, 40 minutes), the operating mode is switched from the normal mode where the device works with the power supplied from the active power sources 22 to the low-power consumption mode where the device works with the power supplied only from the low-power consumption sources 23. By detecting the variation in voltage data acquired by the voltage detecting ICs 21-1 to 21-5 and switching the operating mode from the normal mode to the low-power consumption mode, the current for detecting the voltage of the secondary battery 13 is not consumed when the voltage of the secondary battery 13 does not vary. That is, when a vehicle stops for a predetermined time period with its ignition turned on, the operating mode can be switched to the low-power consumption mode. Accordingly, it is possible to provide a voltage measuring device for multiple-set battery which can suppress power consumption with high precision.

Since the normal mode is switched to the low-power consumption mode via the second isolating interface 35 connected to the main microcomputer 33, a complicated circuit configuration for switching the normal mode to the low-power consumption mode is not necessary, thereby reducing the number of components and thus reducing manufacturing costs.

When the charging or discharging current is detected by the current sensor 34 after the low-power consumption mode setting signal is output, the low-power consumption mode is switched to the normal mode. Accordingly, when the current of the secondary battery 13 is consumed in the low-power consumption mode, the operating mode can be switched to the normal mode so as to detect the voltages of the voltage detecting ICs 21-1 to 21-5. Therefore, it is possible to provide a voltage measuring device for multiple-set battery with high general usability.

When the charging or discharging current is not detected until the second predetermined time period (for example, 1 hour) has passed after the low-power consumption mode setting signal is transmitted, a switching signal for switching the operating mode to the normal mode only for a specific time period is transmitted at the time point that the second predetermined time period has passed. Accordingly, since any abnormalities in the secondary battery 13 can be checked by periodically detecting the voltage of the secondary battery 13 even in the low-power consumption mode, it is possible to provide a voltage measuring device for multiple-set battery with high general usability.

When the operating mode is set to the low-power consumption mode and the voltage reading request of the voltage detecting ICs 21-1 to 21-5 is given from a higher-level device, the newest voltage data among the voltage data stored in the register is transmitted to the higher-level device. When the operating mode is set to the low-power consumption mode, the voltage detecting ICs 21-1 to 21-5 do not detects the voltages of the blocks. Accordingly, when the voltage data is not transmitted in response to the voltage reading request, the higher-level device determines that the voltage detecting ICs 21-1 to 21-5 are out of order, thereby making it necessary to change the configuration of the higher-level device. However, it is possible to reduce the power consumption without changing the configuration of the higher-level device, by transmitting the newest voltage data to the higher-level device.

Although the voltage measuring device according to the invention has been described with reference to the embodiments, the invention is not limited to the embodiments, but the configurations of the elements can be replaced with other configurations having the same functions.

For example, although it has been described in the above-mentioned embodiments that the main microcomputer 33 transmits the low-power consumption mode setting signal and the normal mode setting signal to the voltage detecting ICs 21-1 to 21-5 via the second isolating interface 35 (second communication circuit), the invention is not limited to this configuration, but this configuration may be appropriately changed. For example, a power source switching unit may be provided to the voltage detecting ICs 21-1 to 21-5 to switch the supply of power from the active power sources 22. In this case, the main microcomputer 33 transmits the low-power consumption mode setting signal and the normal mode setting signal to the power source switching unit via the first isolating interface 32. By causing the low-power consumption sources 23 to supply the power to the first isolating interface 32, the second isolating interface 35 may be omitted.

Although it has been described in the above-mentioned embodiments that the first predetermined time period is 30 minutes, the second predetermined time period is 1 hour, and the third predetermined time period is 40 minutes, the invention is not limited to these time periods, but these time periods may be appropriately changed.

Although it has been described in the above-mentioned embodiments that the voltage of a high-voltage battery mounted on a hybrid vehicle or an electric vehicle is measured, the invention is not limited to this example, but may be applied to other batteries.

The invention is useful for reducing the power consumption of a secondary battery.

REFERENCE SIGNS LIST

10: VOLTAGE MEASURING DEVICE
11: HIGH-VOLTAGE SIDE DEVICE
12: LOW-VOLTAGE SIDE DEVICE
13: SECONDARY BATTERY
21-1 to 21-5: FIRST TO FIFTH VOLTAGE DETECTING ICS
22: ACTIVE POWER SOURCE
23: LOW-POWER CONSUMPTION SOURCE
24: CELL VOLTAGE INPUT UNIT
25: MULTIPLEXER
26: A/D CONVERTER
27: CONTROLLER
28: COMMUNICATION UNIT
31: COMMUNICATION LINE
32: FIRST ISOLATING INTERFACE
33: MAIN MICROCOMPUTER
34: CURRENT SENSOR
35: SECOND ISOLATING INTERFACE
61-1 to 61-5: FIRST TO FIFTH BLOCKS
71-1 to 71-5: REFERENCE POWER SOURCES

What is claimed is:

1. A voltage measuring device for measuring an output voltage of a multiple-set battery having a plurality of unit cells which are connected in series to output a voltage, the voltage measuring device comprising:
   a current detecting section that detects a charging or discharging current of the multiple-set battery;
   block voltage detecting sections that detect voltages of a plurality blocks respectively, wherein the unit cells are divided into the blocks; and a control section connected to the block voltage detecting sections via a first communication line and a second communication line and that outputs a voltage measuring request to the block voltage detecting sections via the first communication line to acquire voltage data detected by the block voltage detecting sections, wherein each of the block voltage detecting sections includes:

an active power source which is supplied with power from the unit cells of corresponding block and supplies power to the block voltage detecting section; and a lower-power source which is supplied with power from the unit cells of the corresponding block and supplies power to a communication section for the second communication line disposed in the block voltage detecting section;

wherein the control section transmits a low-power consumption mode setting signal to the block voltage detecting sections respectively via the second communication line when the charging or discharging current has not been detected by the current detecting section for a first time period; and wherein each of the block voltage detecting sections switches an operating mode from a normal mode where the block voltage detecting section is activated with the power from the active power source to a low-power consumption mode where the block voltage detecting section is activated with the power supplied only from the low-power consumption source when the low-power consumption mode setting signal is received.

2. The voltage measuring device according to claim 1, wherein the control section transmits a normal mode setting signal to the block voltage detecting sections respectively via the second communication line when the charging or discharging current is detected after the low-power consumption mode setting signal is transmitted; and wherein each of the block voltage detecting sections switches the operating mode to the normal mode when the normal mode setting signal is received.

3. The voltage measuring device according to claim 1, wherein when the charging or discharging current is not detected until a second time period elapses after the low-power consumption mode setting signal is transmitted, the control section transmits a switching signal for switching the block voltage detecting sections respectively to the normal mode only for a specific time period at the time point that the second time period has elapsed; and wherein the control section transmits a voltage measuring request to the block voltage detecting sections respectively via the first communication line within the specific time period and acquires voltage data detected by the block voltage detecting sections respectively.

4. A voltage measuring device for measuring an output voltage of a multiple-set battery having a plurality of unit cells which are connected in series to output a voltage, the voltage measuring device comprising:

block voltage detecting sections that detect voltages of a plurality blocks respectively, wherein the unit cells are divided into the blocks; and a control section connected to the block voltage detecting sections via a first communication line and a second communication line and that outputs a voltage measuring request to the block voltage detecting sections via the first communication line to acquire voltage data detected by the block voltage detecting sections, wherein each of the block voltage detecting sections includes:

an active power source which is supplied with power from the unit cells of corresponding block and supplies power to the block voltage detecting section; and a lower-power source which is supplied with power from the unit cells of the corresponding block and supplies power to a communication section for the second communication line disposed in the block voltage detecting section;

wherein the control section includes a voltage variation detecting section for detecting variation of the voltage data acquired by the block voltage detecting sections respectively;

wherein the control section transmits a low-power consumption mode setting signal to the block voltage detecting sections respectively via the second communication line when a voltage variation has not been detected by the voltage variation detecting section for a third time period; and wherein each of the block voltage detecting sections switches an operating mode from a normal mode where the block voltage detecting section is activated with the power from the active power source to a low-power consumption mode where the block voltage detecting section is activated with the power supplied only from the low-power consumption source when the low-power consumption mode setting signal is received.

* * * * *